(12) United States Patent
Kittilä et al.

(10) Patent No.: US 9,590,619 B2
(45) Date of Patent: Mar. 7, 2017

(54) GATE DRIVE CIRCUIT WITH A VOLTAGE STABILIZER AND A METHOD

(71) Applicant: ABB OY, Helsinki (FI)

(72) Inventors: Jukka-Pekka Kittilä, Helsinki (FI); Mika Niemi, Helsinki (FI); Mikko Saarinen, Helsinki (FI)

(73) Assignee: ABB Oy, Helsinki (FI)

( * ) Notice: Subject to any disclaimer, the term of this patent is extended or adjusted under 35 U.S.C. 154(b) by 65 days.

(21) Appl. No.: 14/631,362

(22) Filed: Feb. 25, 2015

(65) Prior Publication Data

US 2015/0381166 A1 Dec. 31, 2015

(30) Foreign Application Priority Data

Feb. 25, 2014 (EP) .................................... 14156570

(51) Int. Cl.
*H03B 21/00* (2006.01)
*H03K 3/00* (2006.01)
*H03K 17/567* (2006.01)
*H03K 17/0812* (2006.01)
*H03K 17/14* (2006.01)
*H03K 17/16* (2006.01)

(52) U.S. Cl.
CPC ....... *H03K 17/567* (2013.01); *H03K 17/0812* (2013.01); *H03K 17/162* (2013.01); *H03K 17/14* (2013.01); *H03K 17/168* (2013.01)

(58) Field of Classification Search
USPC ................................................ 327/108–112
See application file for complete search history.

(56) References Cited

U.S. PATENT DOCUMENTS

| | | | | |
|---|---|---|---|---|
| 4,321,490 A | * | 3/1982 | Bechdolt | H03K 19/0136 326/19 |
| 4,698,525 A | * | 10/1987 | Tavana | H03K 19/088 326/128 |
| 5,041,743 A | * | 8/1991 | Matsumoto | H03K 19/0136 326/18 |
| 5,109,170 A | * | 4/1992 | Huijsing | H03F 3/3093 327/538 |
| 5,126,593 A | * | 6/1992 | Mahler | H03K 19/00353 326/128 |
| 5,206,546 A | * | 4/1993 | Usami | H03K 19/09448 326/110 |

(Continued)

FOREIGN PATENT DOCUMENTS

| | | |
|---|---|---|
| CN | 201536357 U | 7/2010 |
| EP | 2495875 A1 | 9/2012 |

(Continued)

OTHER PUBLICATIONS

European Search Report issued on Aug. 25, 2014 by the European Patent Office in corresponding European Patent Application No. 14 15 6570. (2 pages).

*Primary Examiner* — Adam Houston
(74) *Attorney, Agent, or Firm* — Taft Stattinius & Hollister LLP (57) ABSTRACT

A gate drive circuit creates a bipolar voltage to a gate of an IGB power transistor, and compensates for Miller currents of the IGB power transistor. The compensating is performed by a switching element connected in series with a capacitor between the gate (X4) and a supply voltage.

20 Claims, 8 Drawing Sheets

(56) References Cited

U.S. PATENT DOCUMENTS

| | | | |
|---|---|---|---|
| 5,859,557 A * | 1/1999 | Schley-May | H03H 11/48 327/108 |
| 5,977,814 A | 11/1999 | Ishii | |
| 6,181,583 B1 * | 1/2001 | Okui | H02M 1/4208 363/45 |
| 6,377,088 B1 * | 4/2002 | Dumas | H02M 7/53835 327/110 |
| 6,570,413 B1 * | 5/2003 | Kumagai | H03K 17/0406 327/108 |
| 7,080,639 B1 | 7/2006 | Pattantyus | |
| 7,141,832 B2 * | 11/2006 | Sugiyama | H01L 23/49844 257/133 |
| 8,138,819 B2 * | 3/2012 | Kuroda | H03K 17/166 327/108 |
| 2009/0058499 A1 | 3/2009 | Yamashiro et al. | |
| 2010/0194451 A1 | 8/2010 | Nuutinen | |
| 2013/0175575 A1 | 7/2013 | Ziemba et al. | |
| 2013/0286692 A1 * | 10/2013 | Patel | H02M 1/32 363/37 |
| 2013/0289911 A1 * | 10/2013 | Patel | H02M 1/126 702/65 |
| 2015/0381166 A1 * | 12/2015 | Kittila | H03K 17/0812 327/109 |
| 2016/0172960 A1 * | 6/2016 | Kataoka | H02M 1/36 327/109 |

FOREIGN PATENT DOCUMENTS

| | | |
|---|---|---|
| GB | 2 417 625 A | 3/2006 |
| JP | 2000333441 A | 11/2000 |
| JP | 2009-213305 A | 9/2009 |
| JP | 2010-75007 A | 4/2010 |
| JP | 2013078258 A | 4/2013 |

* cited by examiner

GATE DRIVE CIRCUIT WITH A VOLTAGE STABILIZER AND A METHOD

RELATED APPLICATION

This application claims priority under 35 U.S.C. §119 to European Patent Application No. 14156570.5 filed in Europe on Feb. 25, 2014, the entire content of which is hereby incorporated by reference in its entirety.

FIELD

The present disclosure relates to a gate drive circuit with an active gate voltage stabilizer for IGB transistors, such as for compensating for Miller currents.

BACKGROUND INFORMATION

US Published Patent Application No. 2010/0194451 A1 discloses a method for controlling an IGBT component and a gate driver. IBGTs are power semiconductor components which are used, for example, as switches in high power applications. An IGBT is a gate controlled component, which can be turned on and off from its gate. IBGTs can include a gate drive circuit unit which is able to quickly charge the internal capacitances of the component for turning on the component. Similarly, the drive circuit can remove the charge from the gate for cutting the current from the component. The gate drivers are connected to the gate and emitter terminals of the components, and a purpose of the driver is to control the potential of the gate with respect to the emitter.

U.S. Pat. No. 7,080,639 B1 describes a circuit for controlling an ignition coil. The circuit includes a first transistor, a second transistor, and a capacitor. The first transistor is connected in electrical series between the ignition coil and a voltage reference. The capacitor is connected between the ignition coil and a control input of the first transistor. The second transistor is configured to selectively connect the capacitor to the voltage reference.

US Published Patent Application No. 2013/0175575 A1 teaches IGBT circuit modules with increased efficiencies. Exemplary embodiments include power supply modules with insulated-gate bipolar transistors that operate with improved efficiencies. These modules can include IGBT circuit modules that can produce high power output with little power loss. Each circuit module can include a single IGBT. Multiple circuit modules may be configured in parallel and/or series configurations. Among other efficiencies, these efficiencies can be realized with decreased turn-on times and/or turn-off times as well as lowering losses during switching. The voltage at the gate may be brought to a full voltage in a time less than the manufacturer-specified current rise time of the IGBT circuit module. The voltage at the gate may be also discharged in a time less than the manufacturer-specified current fall time of the IGBT circuit module.

U.S. Pat. No. 6,570,413 B1 discloses a drive circuit for a voltage controlled switching device, such as insulated-gate bipolar transistors, which is used in a power conversion device, such as in an inverter for motor speed control; that is, a circuit for accepting external ON/OFF signals as inputs to generate and apply signals for ON/OFF drive directly applied to a control terminal of the voltage-controlled semiconductor switching device. A drive circuit is disclosed as having a function of minimizing a turn-on time, power dissipation and noise generation in a driven voltage-controlled semiconductor switching element.

GB Document No. 2417625 A teaches that the capacitance of an IGBT gate is determined without turning on the IGBT, and the driving current waveform for the IGBT gate when the IGBT is conducting is modified in dependence on the capacitance. In this way, an optimum switching speed may be obtained despite replacement of the IGBT by a newer or different IGBT. The optimum switching speed can reduce switching losses, prevent shoot-through current and allow conformance with electromagnetic compatibility (EMC) regulations.

CN Document No. 201536357 U describes an IGBT driving device which can include a switch control circuit and a pulse transformer isolation drive circuit, wherein an input end of the switch control circuit receives driving signals of an IGBT, an output end of the switch control circuit is connected with a primary circuit of the pulse transformation isolation drive circuit, IGBT driving signals are transmitted to a secondary circuit thereof by the pulse transformer isolation drive circuit in isolation way, and an output end of the secondary circuit is connected with a control port of the IGBT. The IGBT driving device can completely isolate a drive input end of the IGBT and a fore drive circuit, effectively reduces the mutual interference between the drive circuit and the IGBT, improves the precision of the IGBT driving signals, assures the IGBT to be precisely driven and controlled under the state of high reliability and safety, and simultaneously can improve the stability and EMC performances of a system.

SUMMARY

A gate drive circuit with an active gate voltage stabilizer is disclosed, comprising: means for creating a bipolar voltage to a gate of an IGB power transistor; and means for compensating for Miller currents of the IGB power transistor, the means for compensating being formed by a switching element connected in series with a capacitor between the gate and a supply voltage input.

A method is disclosed for controlling an IGB power transistor with a gate drive circuit, which method comprises: creating a bipolar voltage to a gate of the IGB power transistor; and compensating for Miller currents of the IGB power transistor with a switching element connected in series with a capacitor between the gate and supply voltage input.

BRIEF DESCRIPTION OF THE DRAWINGS

For a more complete understanding of particular embodiments of features disclosed herein and their advantages, reference is made to the following exemplary embodiments, taken in conjunction with the accompanying drawings. In the drawings.

DETAILED DESCRIPTION

The present disclosure describes a system for stabilization of voltage of an IGBT during switching and compensating for Miller currents. The system should, for example, ensure operation without occurrence of a local voltage peak with subsequent voltage oscillation. Exemplary embodiments are useful, for example, for power switching elements.

A gate drive circuit is disclosed with an active gate voltage stabilizer having means for creating a bipolar voltage to a gate of an IGB transistor, and means for compensating for Miller currents of the IGB transistor, whereby the means for compensating are formed by a switching element connected in series with a capacitor between the gate and supply voltage.

In an exemplary embodiment, the means for compensating includes a ceramic capacitor and a power MOSFET connected in series.

In an exemplary embodiment, the switching voltage of the switching element is controlled by resistances.

In an exemplary embodiment, a resistor connected between source and gate of the switching element is a NTC-resistor.

In an exemplary embodiment, the means for compensating are connected between positive supply voltage and gate of the IGB transistor.

Considerable advantages can be achieved by embodiments as disclosed herein. For example, a local voltage peak with subsequent voltage oscillation can be avoided with a system as disclosed herein. Further switching losses and collector voltage change speed can be reduced, while decreasing EMC disturbances.

With exemplary embodiments, a capacitance stabilizing the gate has the greatest capacitance when needed and lowest capacitance other times. Hence coupling delays can be at minimum level both in connection with switching on and switching off phases. Also the change rate of gate voltage may be increased.

Maximum voltage can be further achieved in a smaller time interval.

Figure 1:
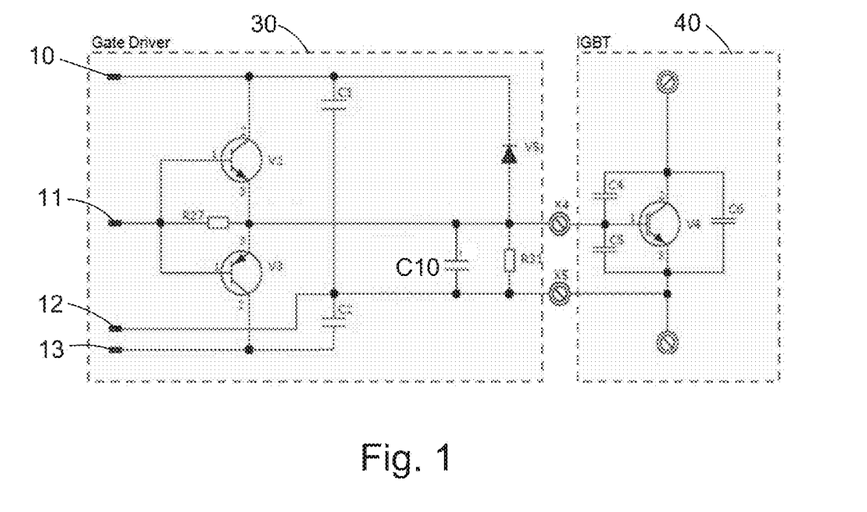
FIG. 1 illustrates a schematic view of a gate drive circuit with an active gate voltage stabilizer according to an exemplary known embodiment.

FIG. 1 is a schematic view of a gate drive circuit 30 with a known gate voltage stabilizer. The terminal 10 represents positive supply voltage, such as +15 V, terminal 11 is a control voltage altering between positive and negative supply voltage, terminal 12 represents voltage that is floating on an IGBT emitter potential and terminal 13 represents a negative supply voltage, such as −15 V. The control voltage 11 can cause either transistor V2 or transistor V3 to enter into a conducting state and therefore gate terminal X4 will be connected to either the positive or negative supply voltage. The Miller current caused by Miller capacitor C4 of the power IGB transistor 40 is compensated by a capacitance C10 connected between terminals X4 and X5. The function of the resistor 31 is to switch off the IGB transistor during a failure operation. Capacitors C1 and C2 are used for stabilizing the operating voltages especially in switching situations. The function of R27 is to compensate a voltage drop of transistors V2 and V3. Due to rather straightforward Miller current compensation by a fixed capacitor C10, this circuit increases switching delays and decreases a voltage slew rate between 10 . . . 15 V and −10 . . . −15 V compared to an active gate voltage stabilizer.

Figure 2:
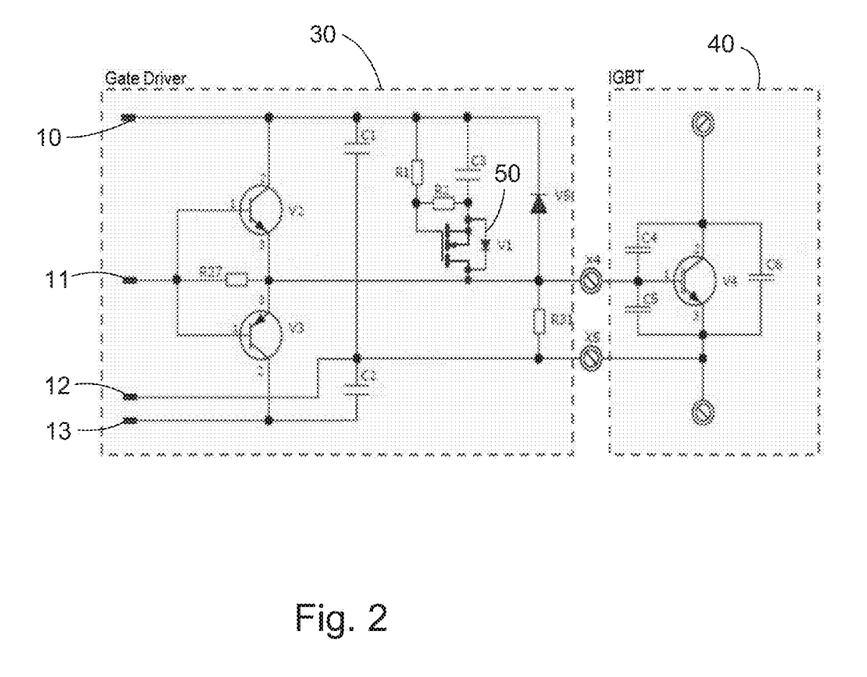
FIG. 2 illustrates a schematic view of a gate drive circuit with an active gate voltage stabilizer according to an exemplary embodiment disclosed herein.

In FIG. 2 a schematic view of a gate drive circuit with an active gate voltage stabilizer according to an exemplary embodiment disclosed herein is illustrated.

In short, the simple capacitance of a known circuit is replaced by a dynamic, active circuit having a capacitor and a switch connected in series between gate terminal and positive supply voltage.

In more detail, the electric circuit itself bears similarity to the known circuit of FIG. 1 but capacitor C10 is replaced by capacitor C3 and a switching transistor V1 connected between positive supply voltage 10 and gate terminal X4. The component V1 is for example, a N-channel power MOSFET connected in series with a ceramic capacitor C3 such that the capacitor C3 is connected between positive supply voltage 10 and the source of V1. The drain of V1 is connected to the gate terminal X4. The gate voltage of V1 is determined by resistors R1 and R2, where R1 is connected between the positive supply voltage 10 and the gate of V1, and R2 is connected between source and gate of V1. The resistor R2 is also referenced in this application as a source-gate resistor. The power MOSFET's internal diode 50 is shown between source and drain terminals. In addition a diode V5 is connected in reverse direction between the positive supply voltage and gate terminal X4 for clamping the gate voltage over the positive supply voltage. In addition a resistor R31 is connected between gate terminal X4 and emitter terminal X5 to switch off the IGB transistor during a failure operation.

The power transistors to be compensated may be IGBT transistors; however, other transistors are also contemplated.

The active gate voltage stabilizer includes for example, an n-channel power MOSFET V1, a ceramic capacitor C3 and two resistances R1, R2.

Figure 3:
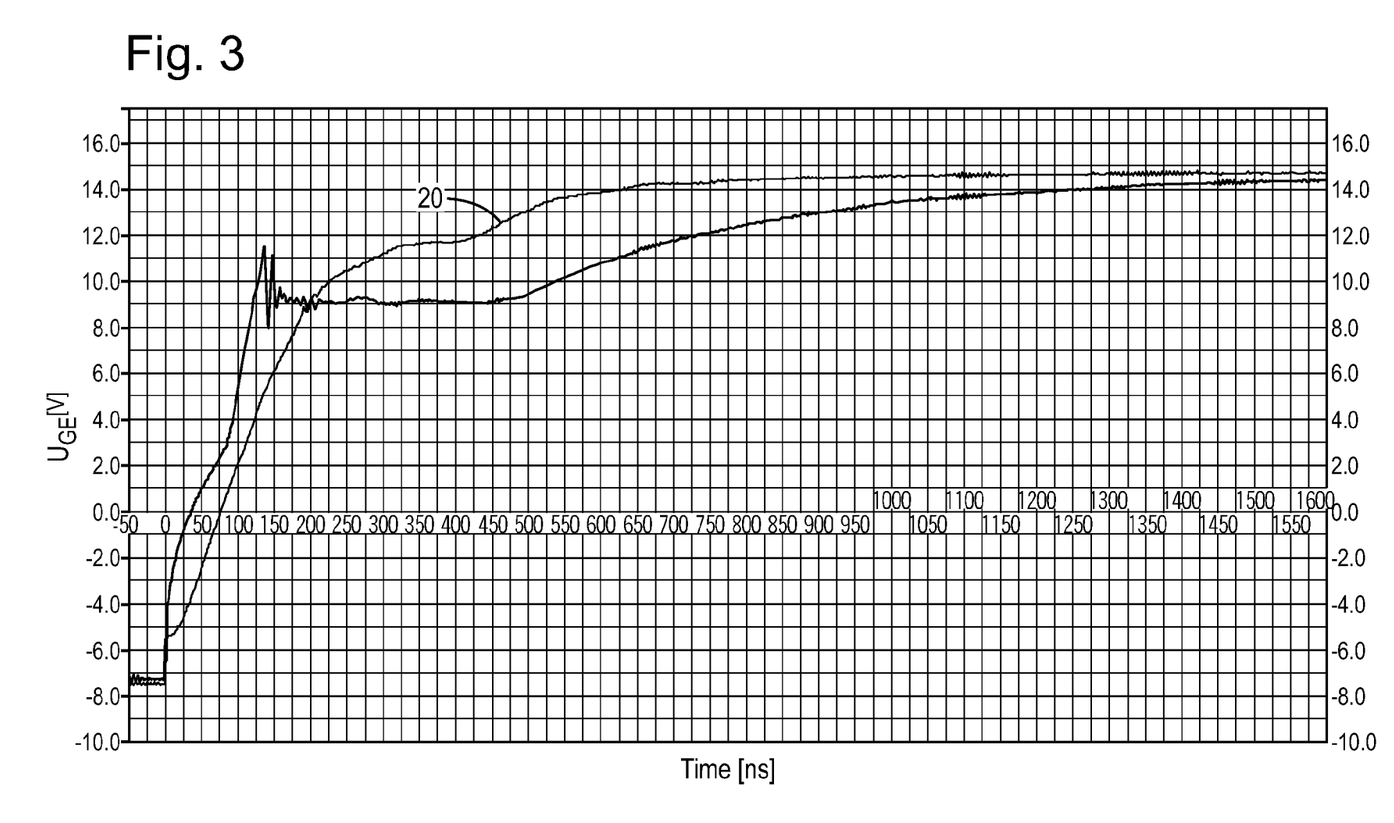
FIG. 3 illustrates an exemplary voltage-time-diagram of the gate voltage with and without features as disclosed herein.

In FIG. 3 a voltage-time-diagram is shown. The first and the second graphs illustrate measurements of an IGBT gate voltage during switching on with (20) or without the coupling disclosed herein. The effect of the Miller current can be seen in both gate voltages in an IGBT turn-on threshold level which is roughly 9 volts. Nevertheless the gate voltage can be seen to be more stable with inclusion of a active stabilizer circuit.

Figure 5:
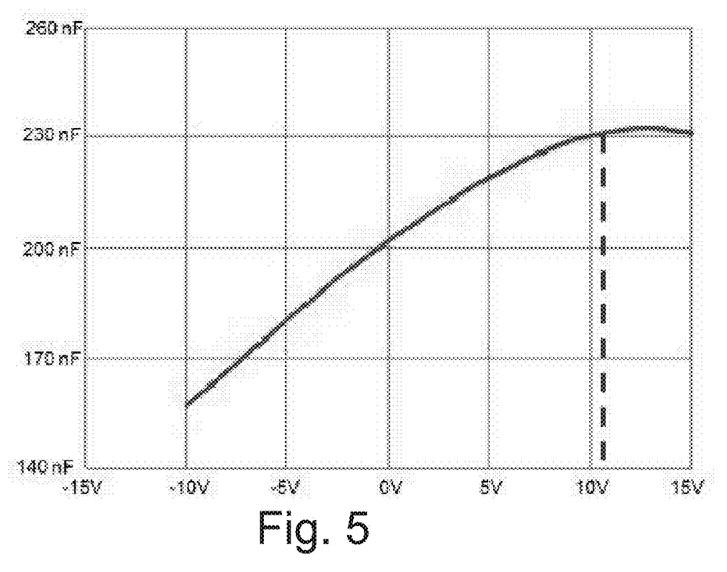
FIG. 5 illustrates an exemplary capacitance of a ceramic condensator as a function of gate-emitter voltage as well as an exemplary off-switching voltage of a power field effect transistor V1.

It is a known fact that capacitance of a ceramic capacitor decreases as a function of terminal voltage (FIG. 5). Therefore, capacitance of capacitor C3 increases in an active gate stabilizer circuit while gate voltage rises, and provides the greatest stability in turn-on threshold voltage and reduces turn-on delay time compared to known stabilizer circuits as shown in FIG. 1.

The FIG. 2 MOSFET V1 disconnects stabilizer capacitor C3 from gate circuitry when the gate voltage exceeds the IGBT turn-on threshold voltage, roughly 11.5V in FIG. 3 and the gate stabilizer is no longer necessary. The disconnection allows the gate voltage to reach its maximum value much faster (FIG. 3 curve 20). The disconnection can be seen as a change of slew rate in the gate voltage in FIG. 3 and it decreases power consumption of the gate driver power supply and reduces IGBT switching losses. However, the greatest value of the stabilizing capacitance C3 remains available during an IGBT turn-on threshold level when it is needed the most.

Figure 4:
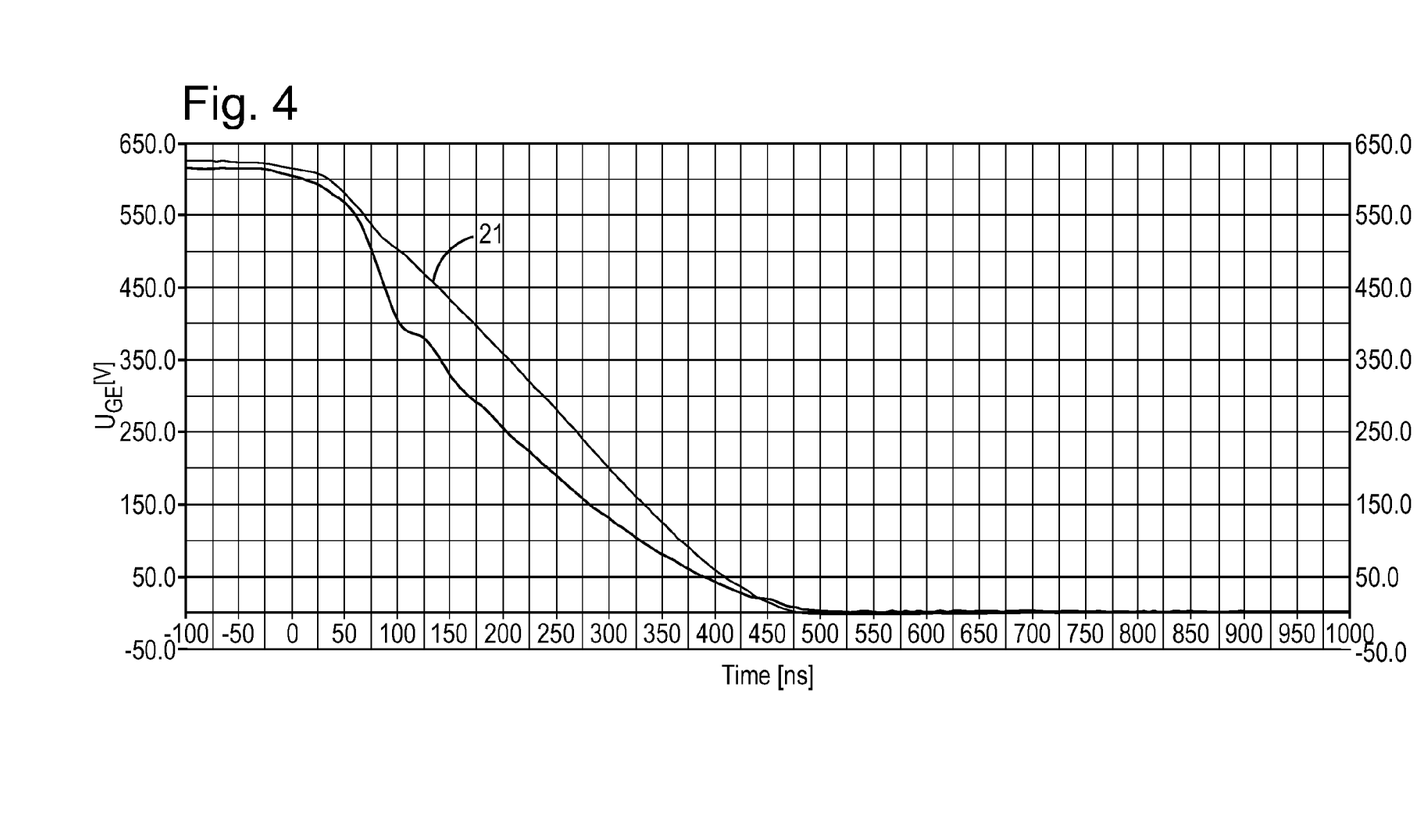
FIG. 4 illustrates an exemplary collector voltage of an IGBT transistor with and without features disclosed herein.

FIG. 4 illustrates a collector voltage of the IGBT transistor with (21) and without features disclosed herein. The sudden voltage drop and greater Miller-effect can be seen in the curve without the active gate stabilizer. The sudden voltage drop produces greater differential voltage slew rate which can be seen in the output of the AC drive causing bearing current and voltage spikes to the AC motors and electromagnetic emissions.

In FIG. 5 the capacitance of a ceramic capacitor C3 is presented as a function of gate-emitter voltage. The vertical dotted line represents a gate voltage value by which the capacitor C3 is disconnected by MOSFET V1 from the gate circuit X4.

Figure 6:
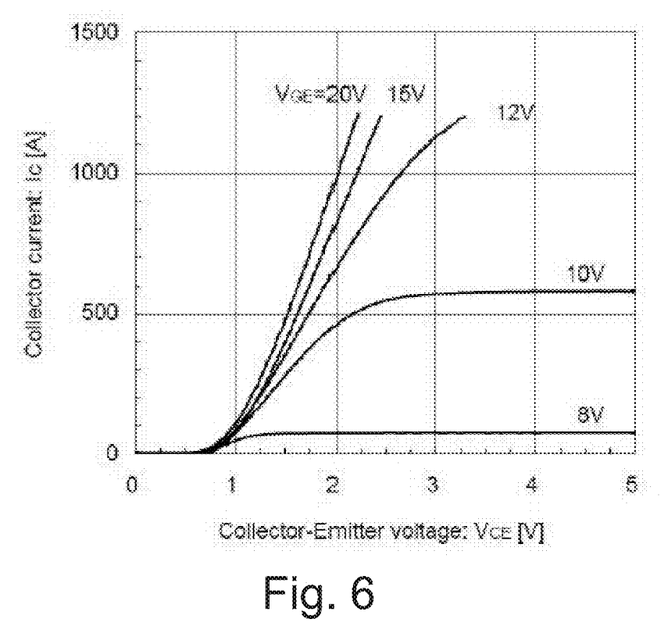
FIG. 6 illustrates an exemplary voltage loss of a IGB transistor with different gate voltages.
Figure 7:
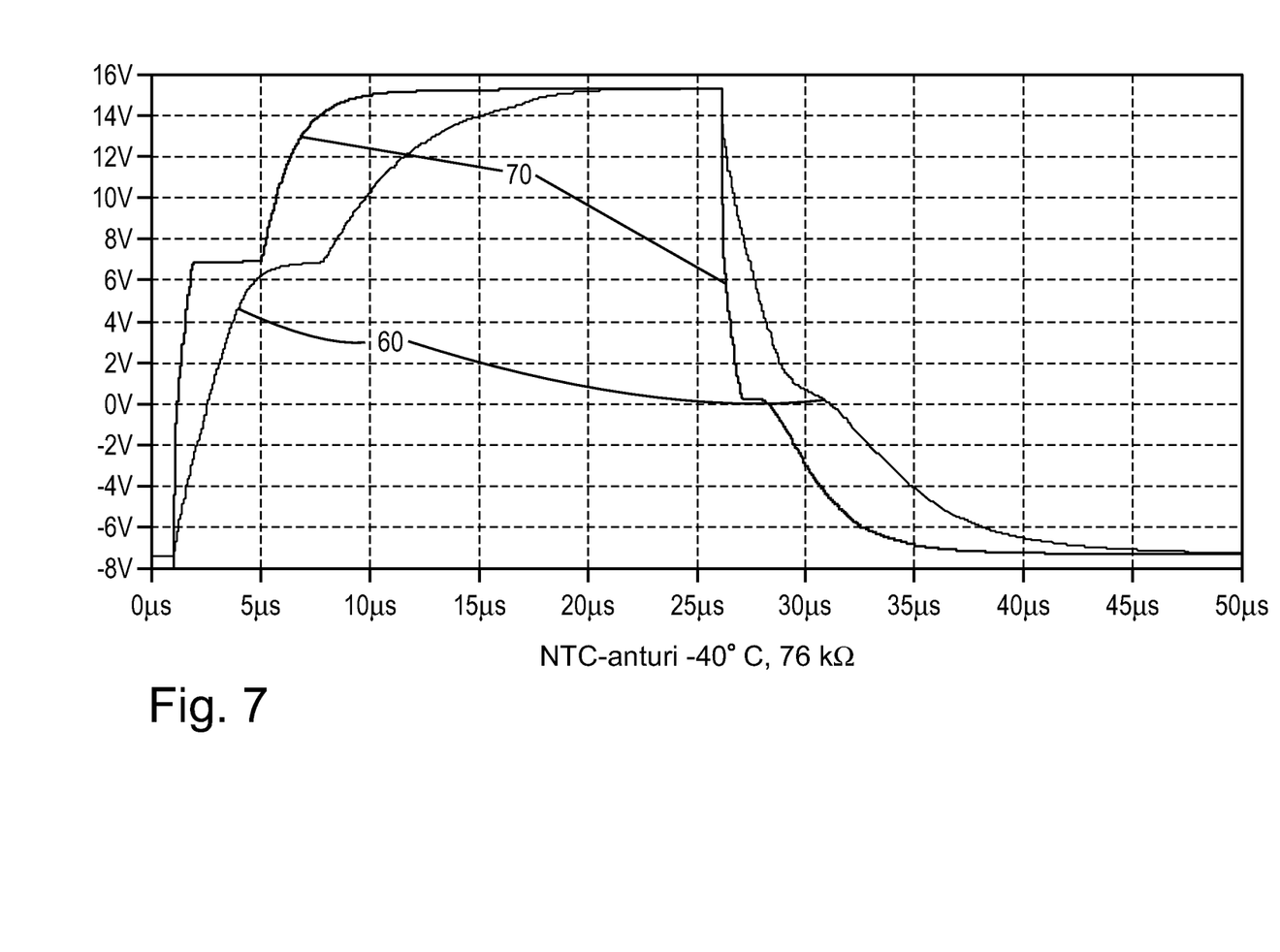
FIG. 7 illustrates a voltage-time-diagram of a gate voltage with and without an exemplary embodiment disclosed herein.
Figure 8:
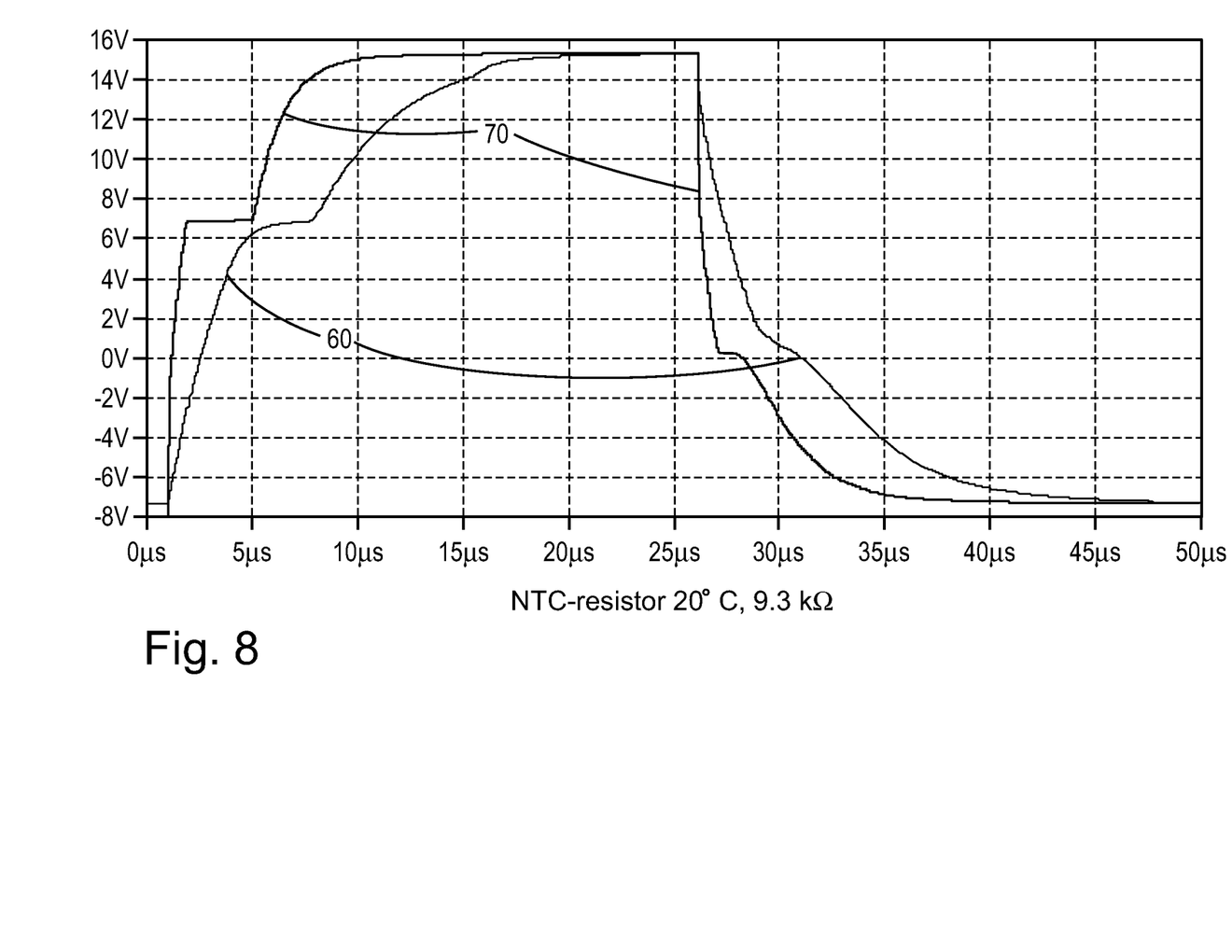
FIG. 8 illustrates a voltage-time-diagram of a gate voltage with and without an exemplary embodiment dislosed herein in a second temperature.
Figure 9:
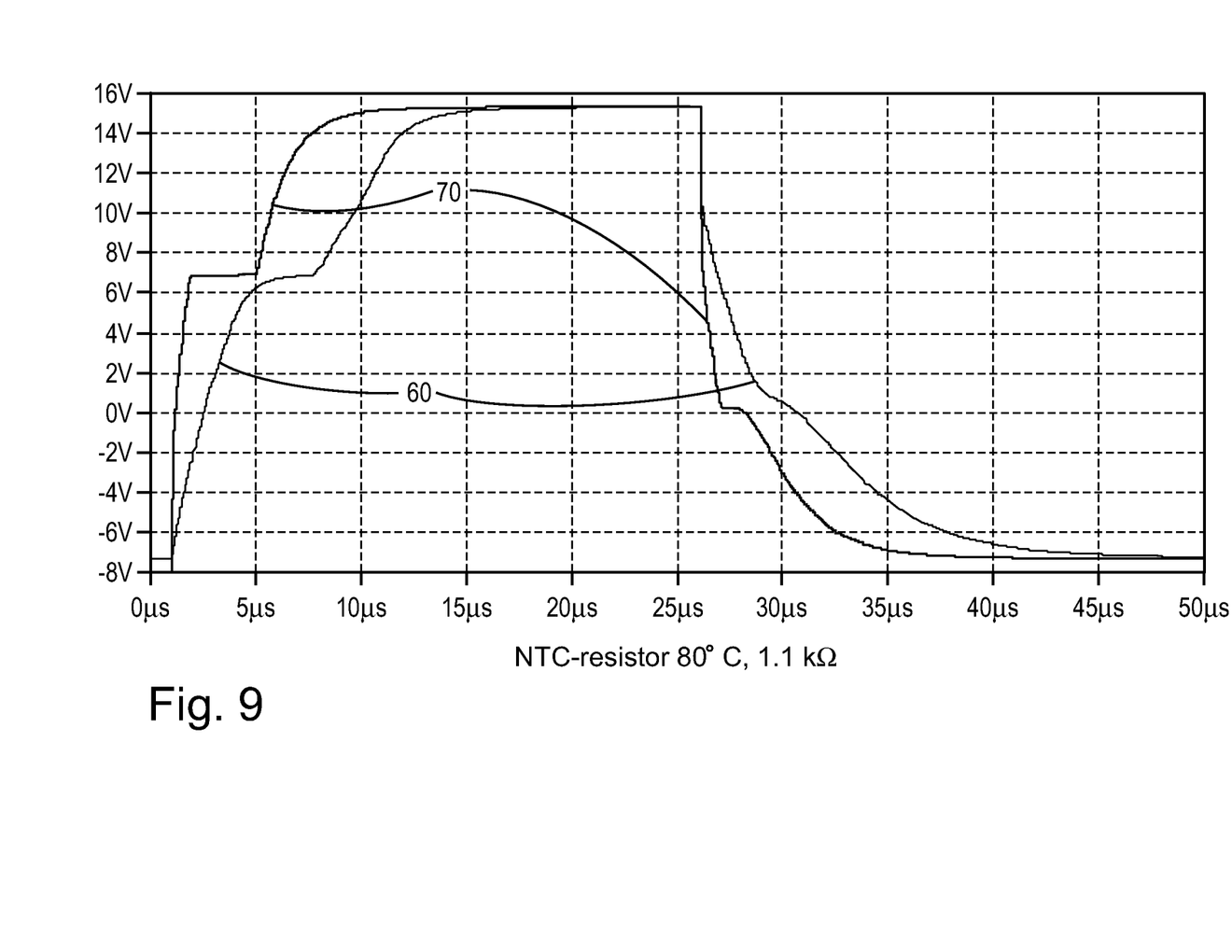
FIG. 9 illustrates a voltage-time-diagram of a gate voltage with and without an exemplary embodiment disclosed herein in a third temperature.
Figure 10:
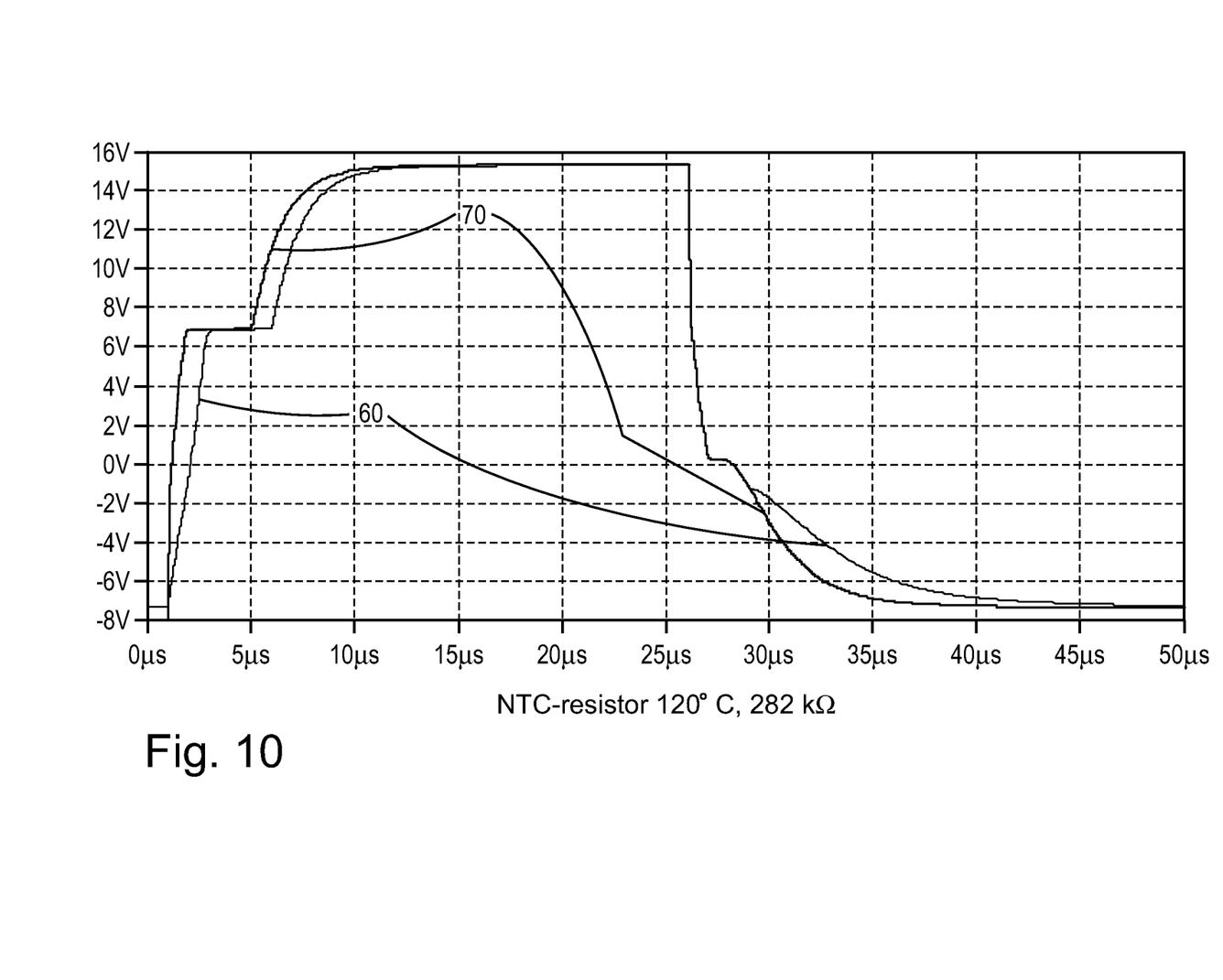
FIG. 10 illustrates a voltage-time-diagram of a gate voltage with and without an exemplary embodiment disclosed herein in a fourth temperature.

FIG. 6 presents the IGBT voltage loss as a function collector current with different gate voltages to provide an understanding of semiconductor power losses.

Although exemplary embodiments have been described in detail for the purpose of illustration, various changes and modifications can be made within the scope of the claims. In addition, it is to be understood that the present disclosure contemplates that, to the extent possible, one or more features of any embodiment may be combined with one or more features of any other embodiment.

For example, exemplary embodiments may be implemented, instead of with a power field effect transistor, with some other switching component to open and close the circuit quickly. These kind of components include, for example, varistors or different kinds on transient suppressors.

In an exemplary embodiment, resistor R2 is a NTC-resistor or thermistor, in other words a resistive component with a Negative temperature coefficient (NTC). The resistance of NTC-resisitors (or thermistors) decreases when the temperature rises.

In this embodiment R2 has been replaced by a NTC-resistor, which is practically measuring the temperature of the IGB transistor 40.

When the voltage of the IGBT gate X4 decreases, also the voltage of the source of V1 decreases because the parallel diode 50 is conducting, therefore C3 is charging. The gate of V1 gets enough voltage and becomes conductive.

While the voltage of the gate of V1 rises the voltage increase is at the beginning slower due to the fact that C3 is discharged through V1. When the voltage divided by the ratio R1/R2 decreases low enough to switch off V1, C3 will be separated from IGB-transistor 40 and the rise of the voltage of the gate X4 of the IGB-transistor 40 will be more rapid. The voltage level for off-switching of V1 depends on the value of the NTC-resistor such that C3 slows down the rise of the voltage of gate X4 longer when the gate X4 is cold. Then the connection losses of the IGBT 40 increase.

In contrast to known circuits where the control is based on switching frequency, an exemplary method in accordance with the present disclosure does not increase a power peak in the power semiconductor chip (power cycling).

This is due to the fact that that the control happens after the actual switching event, whereby the temperature load of the chip has started to decrease and the chip is recovering from the switching event.

With exemplary embodiments disclosed herein, the decreasing edge of the temperature load curve may be adjusted such that the decreasing edge of a hot module (chip or its part) decreases faster than the corresponding edge of a cold module. The compensating of thermal cycling takes place by changing voltage losses in a conducting state of the IGBT 40 even though the control happens during the state change of the IGBT 40.

FIGS. 7-10 show IGBT 40 voltage curves 60 in different temperatures with an exemplary circuit as disclosed herein. Reference curves 70 are without the circuit.

With this embodiment, the life time of the IGT transistors may be increased due to decreased temperature load and variation.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE NUMBERS

C1 capacitor
C3 ceramic capacitor
C6 capacitor
V1 MOSFET
V2 transistor
V3 transistor
R1 resistor
R2 source-gate resistor, in one embodiment NTC-resistor
R27 resistor
R31 resistor
X4 gate terminal
X5 emitter terminal
10 positive supply voltage
11 control voltage
12 ground voltage
13 negative supply voltage
20 graph in accordance with the invention
21 graph in accordance with the invention
30 gate driver
40 IGB transistor
50 parallel diode of V1
60 curve in accordance with the invention
70 curve without the invention

The invention claimed is:

1. A gate drive circuit with an active gate voltage stabilizer, comprising:
   means for creating a bipolar voltage to a gate of an IGB power transistor; and
   means for compensating for Miller currents of the IGB power transistor, the means for compensating being formed by a switching element connected in series with a capacitor between the gate and a supply voltage input;
   wherein a switching voltage of the switching element is controlled by two resistances; and
   wherein one of the two resistances is connected between a source and gate of the switching element, and is an NTC-resistor.

2. The gate drive circuit according to claim 1, wherein the means for compensating comprises:
   a ceramic capacitor as the capacitor, and a power MOSFET as the switching element connected in series.

3. The gate drive circuit according to claim 1, wherein the means for compensating is connected between a positive supply voltage and the gate of the IGB transistor.

4. The gate drive circuit according to claim 1, wherein the switching element is a varistor or transient suppressor.

5. A method for controlling an IGB power transistor with a gate drive circuit, which method comprises:
   creating a bipolar voltage to a gate of the IGB power transistor;
   compensating for Miller currents of the IGB power transistor with a switching element connected in series with a capacitor between the gate and supply voltage input; and
   controlling a switching voltage of the switching element by two resistances;
   wherein one of the two resistances is a resistor connected between a source and gate of the switching element, and is an NTC-resistor.

6. The method according to claim 5, whereby the compensating is performed by a ceramic capacitor as the capacitor, and a power MOSFET as the switching element connected in series.

7. The method according to claim 6, wherein the switching element and capacitor are connected between a positive supply voltage of the supply voltage input and the gate of the IGB transistor.

8. The method according to claim 5, wherein the switching element is a varistor or transient suppressor.

9. The method according to claim 5, wherein the compensating is performed after an actual switching event, when a temperature load of a chip housing the IGB power transistor has started to decrease and the chip is recovering from the switching event.

10. The method according to claim 9, wherein a decreasing edge of a temperature load curve is adjusted such that a decreasing edge of at least a heated portion of the chip decreases faster than a corresponding edge of an unheated cold module.

11. The method according to claim 9, comprising:
    compensating thermal cycling by changing voltage losses in a conducting state of the IGBT power transistor even though control occurs during a state change of the IGBT power transistor.

12. The gate drive circuit according to claim 2, wherein the means for compensating is connected between a positive supply voltage and the gate of the IGB transistor.

13. The gate drive circuit according to claim 12, wherein the switching element is a varistor or transient suppressor.

14. The method according to claim 5, wherein the compensating is performed after an actual switching event, when a temperature load of a chip housing the IGB power transistor has started to decrease and the chip is recovering from the switching event.

15. The method according to claim 10, comprising:
    compensating thermal cycling by changing voltage losses in a conducting state of the IGBT power transistor even though control occurs during a state change of the IGBT power transistor.

16. The method according to claim 5, wherein the switching element and capacitor are connected between a positive supply voltage of the supply voltage input and the gate of the IGB transistor.

17. The method according to claim 6, wherein the switching element is a varistor or transient suppressor.

18. The method according to claim 6, wherein the compensating is performed after an actual switching event, when a temperature load of a chip housing the IGB power transistor has started to decrease and the chip is recovering from the switching event.

19. The method according to claim 18, wherein a decreasing edge of a temperature load curve is adjusted such that a decreasing edge of at least a heated portion of the chip decreases faster than a corresponding edge of an unheated cold module.

20. The method according to claim 19, comprising:
    compensating thermal cycling by changing voltage losses in a conducting state of the IGBT power transistor even though control occurs during a state change of the IGBT power transistor.

* * * * *